United States Patent [19]

Palladino

[11] Patent Number: 5,321,626
[45] Date of Patent: Jun. 14, 1994

[54] BATTERY PERFORMANCE MONITORING AND FORECASTING SYSTEM

[75] Inventor: Peter J. Palladino, Burlington, N.J.

[73] Assignee: SPD Technologies Inc.

[21] Appl. No.: 765,087

[22] Filed: Sep. 25, 1991

[51] Int. Cl.[5] ............................................. G01R 19/00
[52] U.S. Cl. ............................ 364/483; 364/551.01; 324/432; 324/437; 340/636
[58] Field of Search ........... 364/481, 483, 552, 551.01, 364/550; 324/158 P, 432, 433, 437, 444; 340/660, 664, 825.08, 636

[56] References Cited

U.S. PATENT DOCUMENTS

| | | | |
|---|---|---|---|
| 4,707,795 | 11/1987 | Alber et al. | 364/550 |
| 4,743,831 | 5/1988 | Young | 320/48 |
| 4,802,115 | 1/1989 | Ginn | 364/900 |
| 4,965,738 | 10/1990 | Bauer et al. | 364/483 |
| 5,170,124 | 12/1992 | Blair et al. | 324/434 |

*Primary Examiner*—Thomas G. Black
*Assistant Examiner*—Michael Zanelli

[57] ABSTRACT

Systems of battery cells and batteries are monitored via sensing probes arranged in assemblies providing digital output signals which indicate sensed physical parameters. Digital data strings are provided to the probes and modified to reflect present values of the sensed physical parameters. The resulting digital data strings are processed and compared to stored historical data to monitor and forecast performance of a system of connected batteries.

5 Claims, 1 Drawing Sheet

BATTERY PERFORMANCE MONITORING AND FORECASTING SYSTEM

BACKGROUND OF THE INVENTION

This invention relates to an apparatus and method for monitoring performance of a system of battery cells and batteries, such as liquid electrolyte lead-acid batteries for example, and for predicting future performance of such systems and batteries based on historical data and projections developed by comparing such historical data with contemporaneously measured data.

DESCRIPTION OF THE PRIOR ART

Apparatus for monitoring the condition of liquid electrolyte lead-acid batteries is known. The operating condition of a liquid electrolyte lead-acid battery and relative readiness of the battery to provide electrical voltage and electrical current upon demand is generally a function, among others, of battery cell temperature, specific gravity of the battery cell electrolyte, voltage potential across the battery cell terminals in an open circuit condition and current provided by the battery when resistance of a fixed, predetermined value is connected across the battery terminals.

As used in connection with this invention the word "sensor" denotes a transducer sensing a single physical parameter of significance to the operation of a battery, as opposed to "probe" which denotes assemblies of numerous transducers sensing numerous physical parameters of significance to battery operation.

To monitor the condition of a plurality of batteries, it is known to connect sensors detecting parameters of one or several batteries to a multiplexer in a manner that the voltage and temperature of the batteries, for example, are provided to the multiplexer. One or more of such multiplexers may be connected to a computer, enabling the computer to receive signals from the multiplexers. Typically, when more than one such multiplexer has been connected to a computer, the computer serially interrogates the multiplexers, where each multiplexer has one or more signals indicative of battery operating parameters input thereto. Such a battery monitoring system may be characterized as a computer serially interrogating a plurality of multiplexers, with each multiplexer in turn serially interrogating a plurality of sensors to ascertain values of selected parameters indicative of various operating conditions of one or more batteries.

More advanced battery monitoring systems utilize a single computer interrogating a plurality of battery operating parameter condition sensors where each battery operating condition sensor produces a signal converted to digital form. The computer generates a string of digital data bytes wherein the number of bytes in the string corresponds to the number of battery operating parameter signals, which have been converted from analog to digital form. As the computer generates the required number of digital data bytes and the resulting digital data string is applied to the batteries of interest, a given battery operating parameter (associated with a given battery) causes a corresponding byte in the digital data string to be correspondingly modified. Hence, by comparing the digital data string after it has been processed by circuitry associated with each individual battery operating parameter sensor, to the digital data string prior to such processing, the computer determines changes in the operating parameters for such batteries.

The more recent monitoring systems just discussed are subject to complete system failure upon failure of a sensor unit associated with just one battery for measuring a single operating parameter of such battery. Additionally, known monitoring systems can accept and process signals from only a relatively limited number of sensors, thereby limiting the number of batteries the system can monitor. Alternatively, known battery condition monitoring systems can be configured to service a larger number of batteries, by monitoring fewer sensors for each battery. This sacrifices some accuracy in determining the batteries' condition since fewer parameters are monitored for each battery. In other words, the known systems can either monitor a relatively small number of batteries with a reasonable degree of accuracy (by monitoring all of the parameters of interest for each of a relatively small number of batteries) or can monitor a larger number of batteries on a less exact or complete basis (by monitoring fewer than all of the parameters of interest for each of a relatively larger number of batteries.)

SUMMARY OF THE INVENTION

This invention provides novel apparatus and method for monitoring and forecasting performance of a system of connected batteries. The apparatus preferably includes a plurality of serially connected probe assemblies for not only sensing but also microprocessing parameters indicative of conditions and operating states of the batteries and providing digital output signals indicative of the sensed physical parameters. Each of the serially connected probe assemblies includes associated microprocessing means for recognizing and appending a selected data element to a digital data string, which element is recognized as corresponding to itself via an address code as the relevant individual probe, to reflect a sensed value of the physical parameter (to which the probe is sensitive) for a given battery. The apparatus of this invention includes means for generating a digital data string and providing the string to all of the serially connected probe assemblies.

The system is provided with the ability to sense the output voltage and current of the connected batteries, for storing historical data indicative of battery performance (as performance relates to the sensed physical parameters).

The apparatus also includes means for receiving the data string (after modification of the data string by the data element modifying means of the prior assemblies and for processing the digital data string to obtain values indicative of present physical parameters of individual ones of the cells of the connected operating batteries when the physical parameters are sensed. The apparatus yet further preferably includes means for comparing the sensed values to the stored historical data and thereby determining corresponding present battery performance and predicting and forecasting future performance based on comparison of the stored historical data to the real time values.

In another of its aspects, this invention provides a method for monitoring and forecasting performance of very large numbers of individual cells, even those in a system of many connected batteries. The method includes sensing physical parameters indicative of operating states of the batteries and of the cells, generating at least one digital data string, and adding selected data elements to the generated digital data string corresponding to the sensed physical parameters of the cells and the batteries, to reflect values of the sensed physical parameters. The method includes processing such parameters as output voltage and current of the connected batteries, processing the digital data string to obtain values indicative of current operating physical parameters of individual ones of the connected batteries or even of individual cells at the time the physical parameters are sensed and, lastly, comparing the sensed values to fixed physical parameter values and determining corresponding actual battery performance from stored historical battery performance.

The method of the invention is practiced by providing a string of digital data to all of the probes in succession and causing the probe assemblies themselves to provide modifications based upon a selected sensed physical parameter, with each probe assembly adding its information in digital form. The sensed physical parameters preferably include, for example, battery electrolyte specific gravity, battery electrolyte temperature, individual battery cell voltage and battery electrolyte level. Systems according to the invention manifest a significant advantage over known battery condition monitoring systems in that very large numbers of probe assemblies included in systems according to the invention are essentially independent and unaffected by failure of a single probe assembly associated with one cell or with one battery. Additionally, systems according to the invention can accommodate an essentially unlimited number of probe assemblies. Moreover, systems in accordance with the invention are inherently faster in gathering and processing data than known battery condition monitoring systems in facilitating simultaneous interrogation of multiple cells and batteries of the same battery power system.

Additionally, systems manifesting the invention provide predictive capability as to operation of the battery system contemporaneously or at other conditions, which may be chosen by the battery condition monitoring system operator. This permits the operator to select a prediction scheme having a relatively higher or relatively lower run time. This may be important from the operator's point of view, depending upon demands to be put upon the battery system in the short term.

The battery condition monitoring and predictive system of the invention further permits alarm limits to be applied to the parameters which are indicative of battery operating condition, thereby permitting an operator to be warned of a potential battery failure, or even a condition leading to possible explosion, in time to take remedial action. These alarm limits may be adjusted, by adjusting the mean of the alarm limit upward or downward, to avoid nuisance tripping of the alarms.

Figure 1:
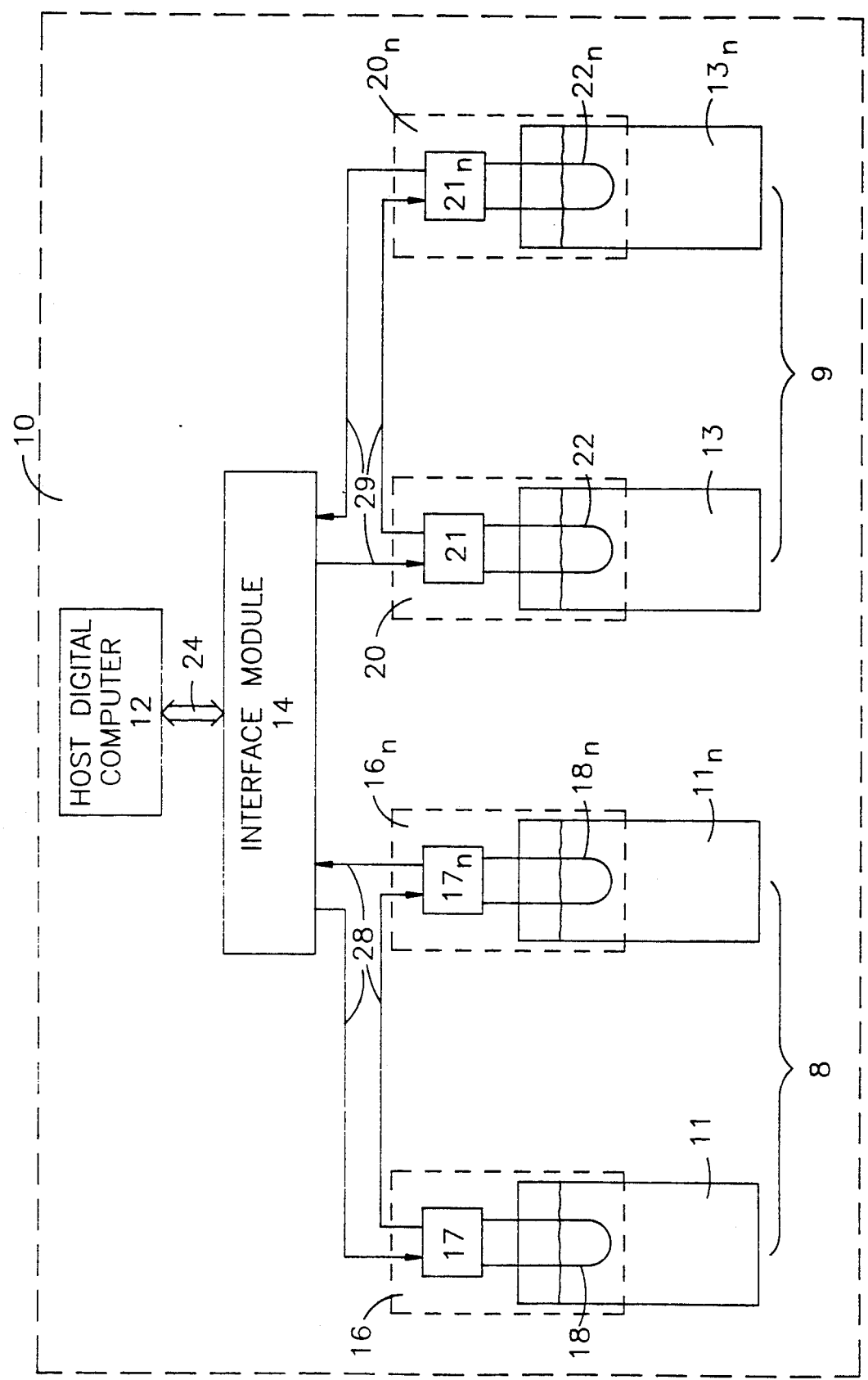
FIG. 1 is a schematic block diagram illustrating one preferred form a battery performance monitoring and forecasting system.

DESCRIPTION OF THE PREFERRED EMBODIMENT AND THE BEST MODE PRESENTLY KNOWN FOR PRACTICING THE INVENTION

Referring to FIG. 1, a battery performance monitoring and forecasting system according to the invention is designated generally 10 and includes a battery 8 having battery cells 11 . . . 11n and a battery 9 having battery cells 13 . . . 13n. The system is controlled by a host digital computer designated generally 12. Connected via data buss 24 to the host computer is an interface module 14, itself a computer, which provides an interface between the individual probes and the host computer. A plurality of probes 16 . . . 16n are connected serially with the interface module to form, a first digital data loop 28. A second plurality of probes designated generally 20 . . . 20n are serially connected with the interface module to form a separate digital data loop 29. While only two digital data loops have been illustrated in FIG. 1, it will be clear that any number of digital data loops may be provided.

Each probe assembly 16 . . . 16n and 20 . . . 20n contains sensors 18 . . . 18n and 22 . . . 22n that typically measure electrolyte temperature, electrolyte level, electrolyte specific gravity and cell voltage, providing DC output signals which are translated to digital equivalents via the probe electronics 17 . . . 17n and 21 . . . 21n, respectively. In turn, this digital data is selectively appended to digital data strings in loops 28 and 29 via a microprocessor which is part of the probe electronics in a manner further to be described. In addition each probe assembly can be made with a bypass relay which routes the digital data string past the probe in the event of its failure, thereby making the overall system immune to failure due to the failure of any particular probe assembly. The electronics in each probe assembly is designed to recognize a data string appearing on the links of the data loops 28 and 29, specifically recognizing the commands in the front portion of the data string generated by the interface module 14. Typical commands are to append any particular sensor information, such as cell voltage, to the data string. Other commands are of a diagnostic nature used for trouble shooting or system initialization or reconfiguration.

Upon recognition of a command to append data, the microprocessor in the probe electronics reproduces the received data string on its outgoing link, adding its address code plus its piece of digitally encoded data to the end of the string, thereby making the string that much longer for the next probe assembly in the loop. In turn the next probe assembly receives this data string and retransmits it, appending its address code and its piece of data.

Interface module 14 collects data from the individual sensors associated with each probe by sending a short command to append a type of sensor data, such as cell voltage, to the first probe in the loop. As each probe receives this command, the probe passes the data string with the command and all collected data plus the probe's own collected data to the next probe until the final probe in the loop passes the complete string back to the interface module. By stripping off the command bytes the microprocessor in the interface module is able to store each piece of data and the respective source of the data, using the address codes, in the microprocessor's local memory.

The interface module can interrogate all sensors in all probes by sequentially sending out commands, on each of the loops, requesting each different type of sensor data. For example, by sending out four commands on a given loop, one at a time, and waiting for the subsequent strings to return, the interface module is able to collect all of the data from all four typical sensors associated with every probe of the batteries associated with that loop. Sending out similar commands on all loops generates separate data strings which carry information about the batteries associated with the respective loops. By continuously requesting (in sequence) all of the different types of probe data available on all of the loops, the interface module is able to maintain a continuously updated record of all battery data in its local memory.

In addition the interface module monitors battery current and terminal voltage on each of the batteries with additional electronics which it polls continuously in the sequence of its operations.

The real time data that the interface module collects and updates is available to the host computer at all times and may be conveyed via data buss 24.

To provide one form of overall battery performance forecasting function, battery voltage, as measured across the battery terminals, and battery output current are provided, preferably in digital form, to interface module 14. These real time data are also provided, together with the digital data, which are continuously collected, by interface module 14 to computer 12. Using preprogrammed algorithms, based on historical battery performance data for the same or similar or comparable batteries, computer 12 predicts battery voltage and current at any future time, based on contemporaneously sensed battery voltage and battery discharge current provided to interface module 14. This may be wholly or partially based on one or more of the sensed battery cell parameters — namely, battery electrolyte specific gravity, battery electrolyte temperature, battery liquid electrolyte level and battery cell voltage.

Any combination of these (or other) parameters may be used to predict battery voltage and discharge current at any selected future time; usually, the more parameters used, the more accurate the prediction.

The system may include not only the sensor digital interface circuitry but also a system processor and auxiliary interface circuitry driving a display monitor and a printer. Such a unit is capable of interfacing with very large numbers of cells and cell probes without any action on the part of the operator. This is of great advantage in a variety of practical applications, particularly including battery operated vehicles and vessels such as submarines, for example, which have multiple batteries each containing a large multiplicity of individual cells.

For marine use the instrument probe assemblies such as 16 and 20 may be screwed into a threaded hole in the top of every battery cell in order to sense cell voltage, electrolyte temperature, electrolyte level and electrolyte specific gravity. The voltage connections may be fused to protect against fault currents, and the entire probe assembly is safe when operating even in an explosive mixture of hydrogen and air.

Preferably the probes are connected in their conductor circuits to quick disconnecting plugs, which are intrinsically safe and suitable for safe operation in an explosive mixture of hydrogen and air. Since the system processing unit is not located in the battery tank, its output connectors will not be exposed to such explosive gas.

All data can be readily stored in the system memory and can readily be updated during the measurement cycle in a period which will not normally exceed one minute. Upon operator demand the system display device can readily display each battery's present status which consists of total voltage, charge/discharge current, average temperature, ampere hours to full charge and complete discharge, prevailing charge factor and gauging voltage. The display can also indicate a list of faulty cells and their voltages, by cell number. The system can also indicate the time to run and the ampere hours available at the current discharge rate, and this is preferably continuously updated automatically. The same information can be displayed based upon current battery status but with a one or two stage input or discharge. This system also readily displays the voltage, density, level and temperature of any selected cell. It further has the capability of indicating cell distribution for each battery and for all batteries, in graphic format or otherwise. The display can also include cell parameter tables for each of the voltage density level and temperature, and a discharge voltage graph for a theoretical discharge rate and for a real time discharge rate.

It is convenient to provide with the system the capability to input and/or change the alarm limits for upper and lower cell voltages and cell temperatures, so that whenever a cell exceeds these limits the system creates an alarm as by a flashing light or by a buzzer. Further, the data regarding the faulty parameters can be automatically displayed and recorded with date and time on the system printer.

Although this invention has been described with reference to particular systems it will be appreciated that many variations may be used within the scope of this invention. For example, various parameters, more or less, may be monitored, recognized and updated independently of others, and various combinations of parameters in various batteries or battery cells may be sensed and processed. While the preferred embodiment of the invention has been described above and alternative embodiments have also been described, the scope of protection to which the invention is believed entitled is defined by the claims and by equivalents thereto which perform substantially the same function in substantially the same way to achieve substantially the same result as set forth in the claims, so long as such substantial equivalents, as defined by a claim for such substantial equivalent, do not read on the prior art.

The following is claimed:

1. Apparatus for monitoring and forecasting performance of a system of connected batteries, comprising:
    a. a plurality of probe assemblies connected for sensing physical parameters indicative of the operating states of said connected batteries, said probe assemblies having an output means providing digital output signals indicative of said sensed physical parameters;
    b. means for generating digital data strings and providing said strings to said probe assemblies;
    c. means associated with said probe assemblies for modifying the digital data strings applied to said probe assemblies to reflect present values of said sensed physical parameters;
    d. means for sensing resulting output voltage and current of said connected batteries;
    e. means for providing historical data battery output voltage and current as functions of said physical parameters;
    f. means receiving said sensed output voltage and current of said connected batteries for processing said digital data strings to obtain real time values indicative of operating parameters of individual ones of said connected batteries when said parameters are sensed; and
    g. means for comparing said values to fixed parameter values and determining corresponding battery performance from said stored historical data; wherein said probe assemblies are serially connected.

2. Apparatus of claim 1 wherein each of said probe assemblies sense a selected physical parameter and each said probe assembly provides a digital output signal indicative of said sensed physical parameter.

3. Apparatus of claim 2 wherein said physical parameters include electrolyte specific gravity, temperature, individual battery voltage and electrolyte level.

4. Apparatus for monitoring and forecasting performance of a system of connected batteries having a multiplicity of individual cells, comprising:
   a. a plurality of serially connected probes, each arranged for sensing physical parameters indicative of an operating state of said batteries or cells and providing a digital output signal indicative of any selected sensed physical parameter;
      i. each of said serially connected probes including probe assembly means for appending a selected data element corresponding to a physical parameter digital data string via a code, to reflect a value of any selected sensed physical parameter;
   b. means for generating a digital data string, providing said string to said serially connected probe assemblies and receiving said data string after modification thereof by said probe assemblies;
   c. means for sensing resulting output voltage and current of said connected batteries;
   d. means for storing historical data of battery performance as a function of said physical parameter;
   e. means receiving said sensed output voltage and current of said connected batteries for processing said digital data string to obtain values indicative of operating physical parameters of individual ones of said connected batteries at time said physical parameters are sensed; and
   f. means for comparing said values to fixed physical parameter values and determining corresponding battery future performance from said stored historical data of battery performance.

5. The apparatus defined in claim 4, wherein said physical parameters include electrolyte specific gravity, temperature, individual battery voltage and electrolyte level.

* * * * *